(12) United States Patent
Zhao

(10) Patent No.: US 11,348,652 B2
(45) Date of Patent: May 31, 2022

(54) NEURAL NETWORK INFERENCE ACCELERATOR BASED ON ONE-TIME-PROGRAMMABLE (OTP) MEMORY ARRAYS WITH ONE-WAY SELECTORS

(71) Applicant: HEFEI RELIANCE MEMORY LIMITED, Hefei (CN)

(72) Inventor: Liang Zhao, Sunnyvale, CA (US)

(73) Assignee: Hefei Reliance Memory Limited, Hefei (CN)

( * ) Notice: Subject to any disclaimer, the term of this patent is extended or adjusted under 35 U.S.C. 154(b) by 0 days.

(21) Appl. No.: 17/078,496

(22) Filed: Oct. 23, 2020

(65) Prior Publication Data

US 2021/0134379 A1    May 6, 2021

Related U.S. Application Data

(60) Provisional application No. 62/927,800, filed on Oct. 30, 2019.

(51) Int. Cl.
*G11C 17/16* (2006.01)
*G06N 3/04* (2006.01)
(Continued)

(52) U.S. Cl.
CPC ............ *G11C 17/16* (2013.01); *G06F 7/5443* (2013.01); *G06N 3/04* (2013.01); *G11C 11/54* (2013.01);
(Continued)

(58) Field of Classification Search
CPC ......... G11C 17/16; G11C 11/54; G11C 17/18; G11C 7/12; G11C 8/14; G11C 8/08;
(Continued)

(56) References Cited

U.S. PATENT DOCUMENTS

| 2009/0268505 | A1* | 10/2009 | Beer | ................... G11C 11/5614 |
| | | | | 365/148 |
| 2013/0307097 | A1* | 11/2013 | Yi | ........................... H01L 43/08 |
| | | | | 257/421 |

(Continued)

OTHER PUBLICATIONS

Rivu Midya et al., "Anatomy of Ag/Hafnia-Based Selectors with 1010 Nolinearity", Advanced Materials, 1604457, 2017 (pp. 1-8).
(Continued)

*Primary Examiner* — Ajay Ojha
(74) *Attorney, Agent, or Firm* — Sheppard Mullin Richter & Hampton LLP

(57) ABSTRACT

The disclosed embodiments provide neural network inference accelerator based on one-time-programmable (OTP) memory arrays with one-way selectors. In some embodiments, a memory array may comprise: a plurality of one-time-programmable memory cells each comprising: a one-time-programmable memory element; a top electrode having an upper surface in contact with the one-time-programmable memory element; a dielectric layer in contact with a lower surface of the top electrode; a bottom electrode; and a dense layer having an upper surface in contact with the dielectric layer, and a lower surface in contact with the bottom electrode, wherein the dense layer comprises $Al_2O_3$ or MgO.

20 Claims, 8 Drawing Sheets

(51) Int. Cl.
*G11C 11/54* (2006.01)
*G06F 7/544* (2006.01)
*H01L 23/525* (2006.01)
*G11C 17/18* (2006.01)

(52) U.S. Cl.
CPC .......... *G11C 17/18* (2013.01); *H01L 23/5256* (2013.01)

(58) Field of Classification Search
CPC .............. G06F 7/5443; H01L 23/5256; H01L 23/5252; G06N 3/04; G06N 3/0454; G06N 3/063; G06N 5/046
See application file for complete search history.

(56) References Cited

U.S. PATENT DOCUMENTS

2014/0241031 A1* 8/2014 Bandyopadhyay .......................... H01L 27/11206
365/96
2014/0293678 A1* 10/2014 Orlowski ............ H01L 45/1253
365/148

OTHER PUBLICATIONS

Jongmyung Yoo et al., "Threshold switching behavior of Ag—Si based selector device and hydrogen doping effect on its characteristics", AIP Advances, vol. 5, 127221, Dec. 18, 2015, pp. 1-6.
Shosuke Fujii et al., "Ag Ionic Memory Cell Technology for Terabit-Scale High-Density Application", 2019 Symposium on VLSI Technology Digest of Technical Papers (2 pages).

* cited by examiner

Prior Art

200 →

| Top Electrode (Ag) 202 | Dielectric 206 | Bottom Electrode 208 |

| Top Electrode (Ag) 302 | Dielectric 306 | Dense Layer 304 | Bottom Electrode 308 |

FIG. 3

NEURAL NETWORK INFERENCE ACCELERATOR BASED ON ONE-TIME-PROGRAMMABLE (OTP) MEMORY ARRAYS WITH ONE-WAY SELECTORS

CROSS REFERENCE TO RELATED APPLICATION

The present application claims priority to U.S. Provisional Patent Application No. 62/927,800, filed Oct. 30, 2019, entitled "Neural Network Inference Accelerator Based On One-Time-Programmable (OTP) Memory Arrays With One-Way Selectors," the disclosure thereof incorporated by reference herein in its entirety.

BACKGROUND

The disclosed technology relates generally to memory technology, and more particularly some embodiments relate to memory devices and methods for using them.

BRIEF DRAWINGS DESCRIPTION

The present disclosure, in accordance with one or more various embodiments, is described in detail with reference to the following figures. The figures are provided for purposes of illustration only and merely depict typical or example embodiments.

FIG. 2 illustrates a conventional selector.

FIG. 3 illustrates a selector according to some embodiments of the disclosed technology.

The figures are not exhaustive and do not limit the present disclosure to the precise form disclosed.

DETAILED DESCRIPTION

Thanks to their threshold switching behaviors, devices comprising a dielectric layer and an Ag electrode are currently being utilized as selectors for memory devices. Most of these uses focus on the integration of two-way selectors with bipolar resistive memories. For those devices with Ag as one electrode and inert metal (e.g., Pt or Pd) as the other electrode, some of the Ag may have a tendency to agglomerate on the inert electrode interface. This poses a serious challenge to the stability of selector, which may exhibit memory behaviors when current is sufficiently high.

Figure 1:
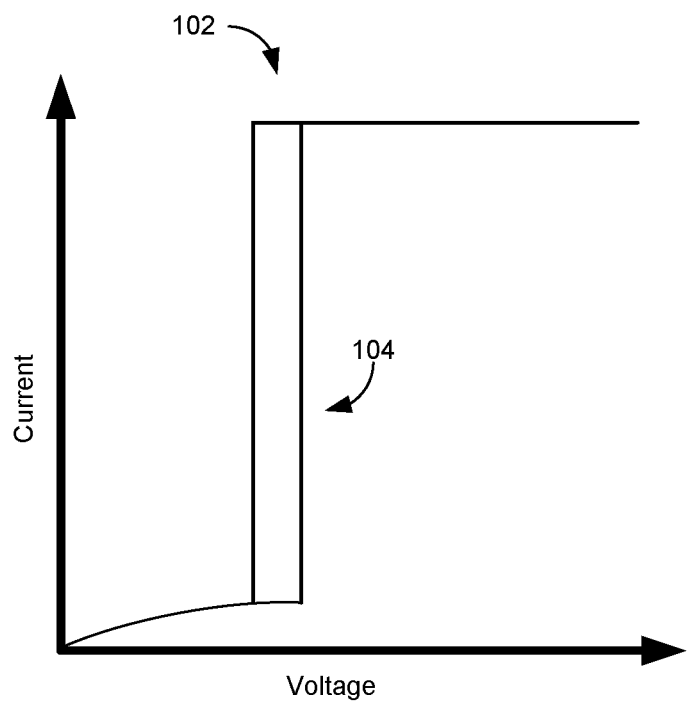
FIG. 1 illustrates two key characteristics of example one-way selectors for a memory array, namely hysteresis and turn-on slope.

Embodiments of the disclosed technology provide devices that can be used as one-way selectors, for example in applications with one-time-programmable (OTP) memory devices. FIG. 1 illustrates two key characteristics of such selectors, namely hysteresis 102 and turn-on slope 104. Referring to FIG. 1, the hysteresis 102 should be small, and the turn-on slope 104 should be large. Embodiments of the disclosed technology achieve these characteristics by disposing a layer of dense material at the interface between the inert metal and the dielectric material. By using suitable materials, the dense layer pushes the metal ions back during turn-off switching. Suitable materials for the dense material include $Al_2O_3$ or MgO.

In some embodiments, a top electrode may include Ag although this disclosure is not limited to this example. In some embodiments, an alloy metal(s) or a dopant(s) can be added into the Ag top electrode. For example, Ti and/or W may be used. These embodiments improve the stability of the Ag electrode, and return the Ag ions faster during turn-off switching.

In some embodiments, the disclosed one-way selector is combined with an OTP memory element to form an OTP memory cell. Some embodiments feature an array of these OTP memory cells.

FIG. 2 illustrates a conventional selector 200. Referring to FIG. 2, the conventional selector 200 includes a dielectric 206 sandwiched between a top electrode 202 made of Ag and a bottom electrode 208, which may be an inert metal. The conventional selector 200 suffers from the problems described above, namely large hysteresis, small turn-on slope, and Ag agglomeration on the bottom electrode 208.

FIG. 3 illustrates a selector 300 according to some embodiments of the disclosed technology. Referring to FIG. 3, the selector 300 includes a dielectric 306 disposed between an Ag top electrode 302 and a bottom electrode 308, which may be an inert metal such as Pt or Pd. Any suitable dielectric may be used, for example such as amorphous Si (a-Si), $HfO_x$, and the like. The selector 300 also includes a dense layer 304 disposed between the dielectric 306 and the bottom electrode 308. The dense layer may be formed from materials such as $Al_2O_3$ or MgO. In some embodiments, the Ag top electrode 302 may be doped or alloyed with one or more other metals. The selector overcomes the problems mentioned above, and possesses desirable characteristics including small hysteresis, large turn-on slope, and little or no Ag agglomeration on the bottom electrode 308.

Figure 4:
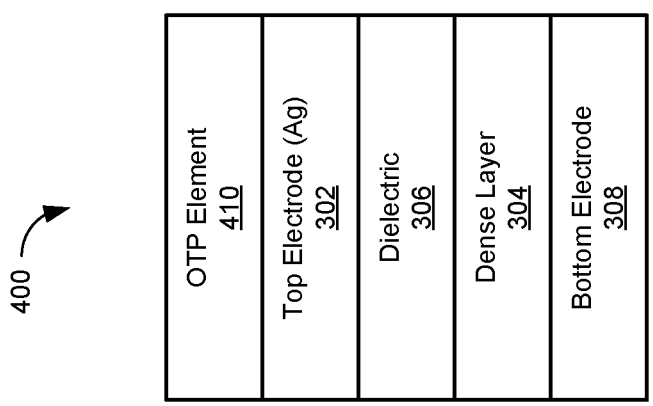
FIG. 4 illustrates an OTP memory cell according to some embodiments of the disclosed technologies.

In some embodiments, the disclosed selectors may be combined with OTP memory elements to form an OTP memory cell. FIG. 4 illustrates an OTP memory cell 400 according to some embodiments of the disclosed technologies. Referring to FIG. 4, the OTP memory cell 400 includes an OTP memory element 410 disposed on top of the selector 300 of FIG. 3. The OTP memory element 410 may be any type of two-terminal resistive OTP memory, including but not limited to those based on oxide breakdown, metal injection, fuse/anti-fuse, and the like.

Figure 5:
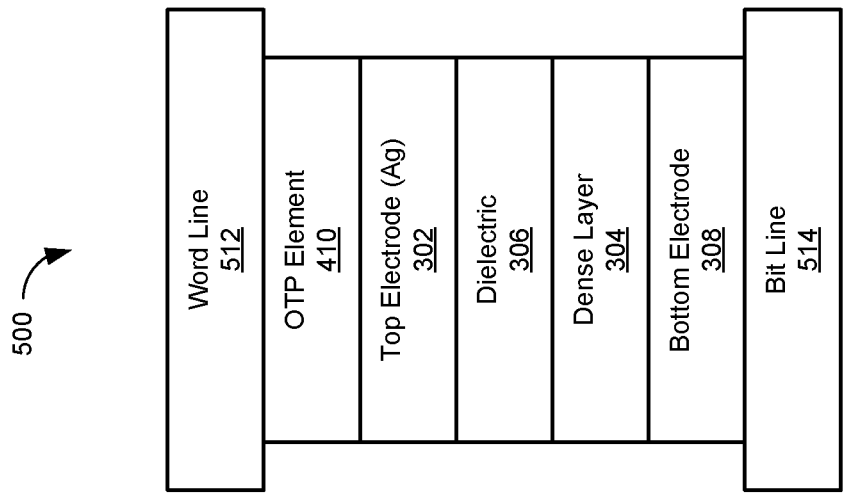
FIG. 5 illustrates an OTP memory device for a memory array according to some embodiments of the disclosed technologies.

In some embodiments, the disclosed OTP memory cells may be connected to word lines and bit lines to form an OTP memory array. FIG. 5 illustrates an OTP memory device 500 for a memory array according to some embodiments of the disclosed technologies. Referring to FIG. 5, the OTP memory device 500 includes the OTP memory cell 400 of FIG. 4 with a word line 512 electrically coupled to the OTP element 410, and with a bit line 514 electrically coupled to the bottom electrode 308.

Figure 6:
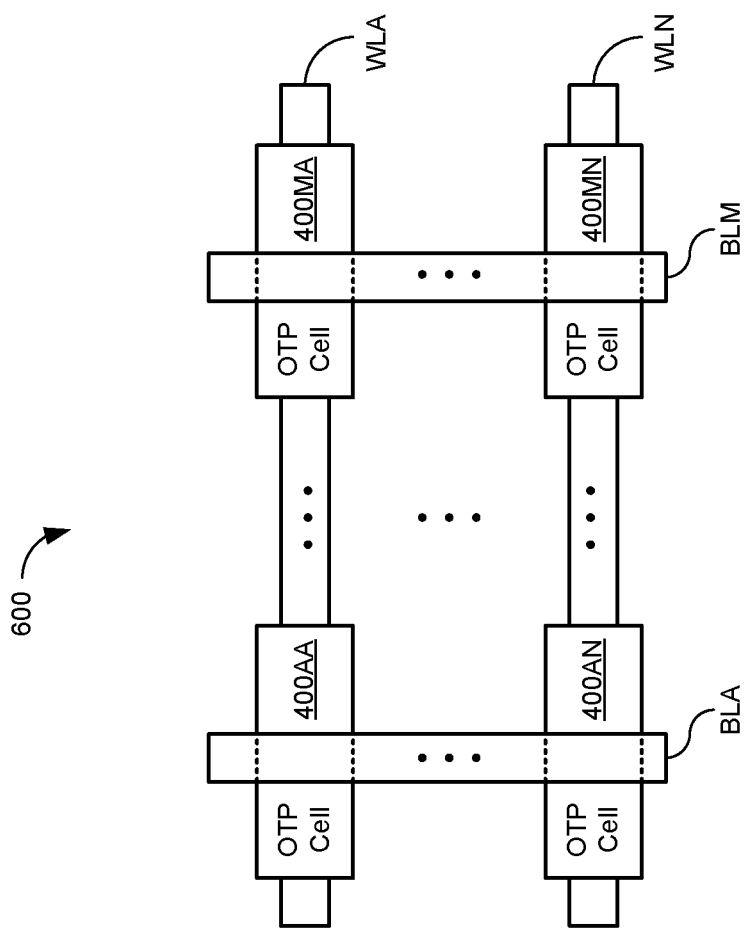
FIG. 6 illustrates an OTP memory array according to embodiments of the disclosed technologies.

In some embodiments, the disclosed OTP memory devices may be connected to form an OTP memory array. FIG. 6 illustrates an OTP memory array 600 according to embodiments of the disclosed technologies. Referring to FIG. 6, the OTP memory array 600 may be a cross-point array that includes M columns of OTP memory cells 400, with each column including N rows of the memory cells 400. Each of the M columns is driven by a one of M bit lines BLA-BLM. Each of the N rows is driven by one of N word lines WLA-WLN. OTP memory cell 400AA is connected to bit line BLA and word line WLA. OTP memory cell 400AN is connected to bit line BLA and word line WLN. OTP memory cell 400MA is connected to bit line BLM and word line WLA. OTP memory cell 400MN is connected to bit line BLM and word line WLN. Other OTP memory cells 400 in the OTP memory array 600 are connected in a similar manner.

Figure 7:
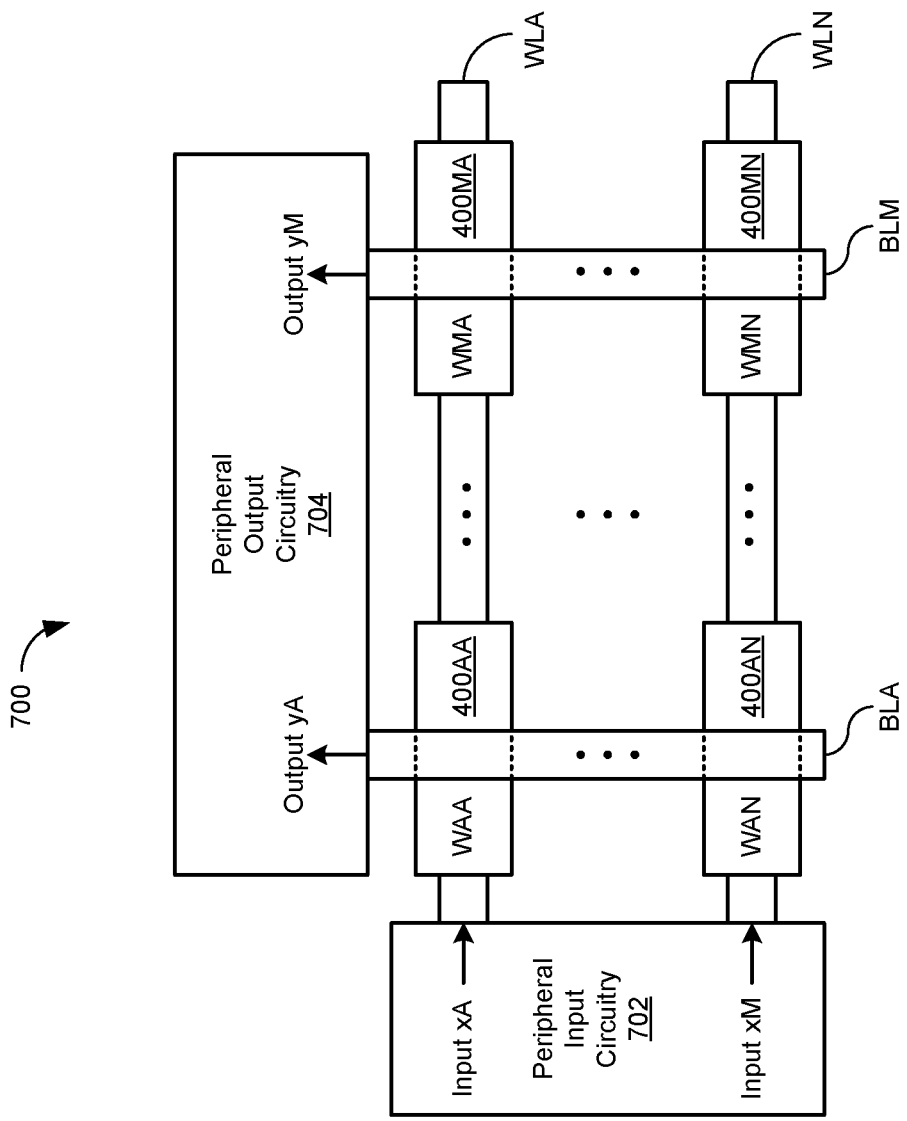
FIG. 7 illustrates a neural network according to some embodiments of the disclosed technology.

In some embodiments, peripheral input and output circuitry may be connected to a programmed array of the disclosed OTP memory cells to form a neural network. FIG. 7 illustrates a neural network 700 according to some embodiments of the disclosed technology. Referring to FIG. 7, the neural network 700 may include the memory array 600 of FIG. 6, peripheral input circuitry 702, and peripheral output circuitry 704. Each memory cell 400 in the array has been programmed with a predetermined weight W. OTP memory cell 400AA has been programmed with a predetermined weight WAA. OTP memory cell 400AN has been programmed with a predetermined weight WAN. OTP memory cell 400MA has been programmed with a predetermined weight WMA. OTP memory cell 400MN has been programmed with a predetermined weight WMN. Other OTP memory cells 400 in the neural network 700 are programmed with predetermined weights in a similar manner.

Multiplication and Accumulation (MAC) may be the most popular operation in neural-network-based algorithms. The neural network 700 of FIG. 7 may be employed to accelerate MAC operations in neural network inference. In the example of FIG. 7, the MAC operation is y=Wx. The result of the MAC operation may be determined from each output y by counting how many bits are on.

During operation, peripheral input circuitry 702 provides inputs x to the word lines WL. Peripheral input circuitry 702 provides input xA to word line WLA. Peripheral input circuitry 702 provides input xM to word line WLM. Peripheral input circuitry 702 provides inputs to other word lines WL in the neural network 700 in a similar manner.

Responsive to the inputs x, the neural network 700 produces outputs y on the bit lines BL. These outputs y are read from the bit lines BL by the peripheral output circuitry 704. Peripheral output circuitry 704 reads output yA from bit line BLA. Peripheral output circuitry 704 reads output yM from bit line BLM. Peripheral output circuitry 704 reads outputs y from other bit lines BL in the neural network 700 in a similar manner.

The disclosed neural networks accelerate MAC operations. Due to the characteristics of the disclosed selector and its one-way nature, sneakpath current may be eliminated or reduced, allowing larger OTP memory arrays for larger neural network model acceleration.

Figure 8:
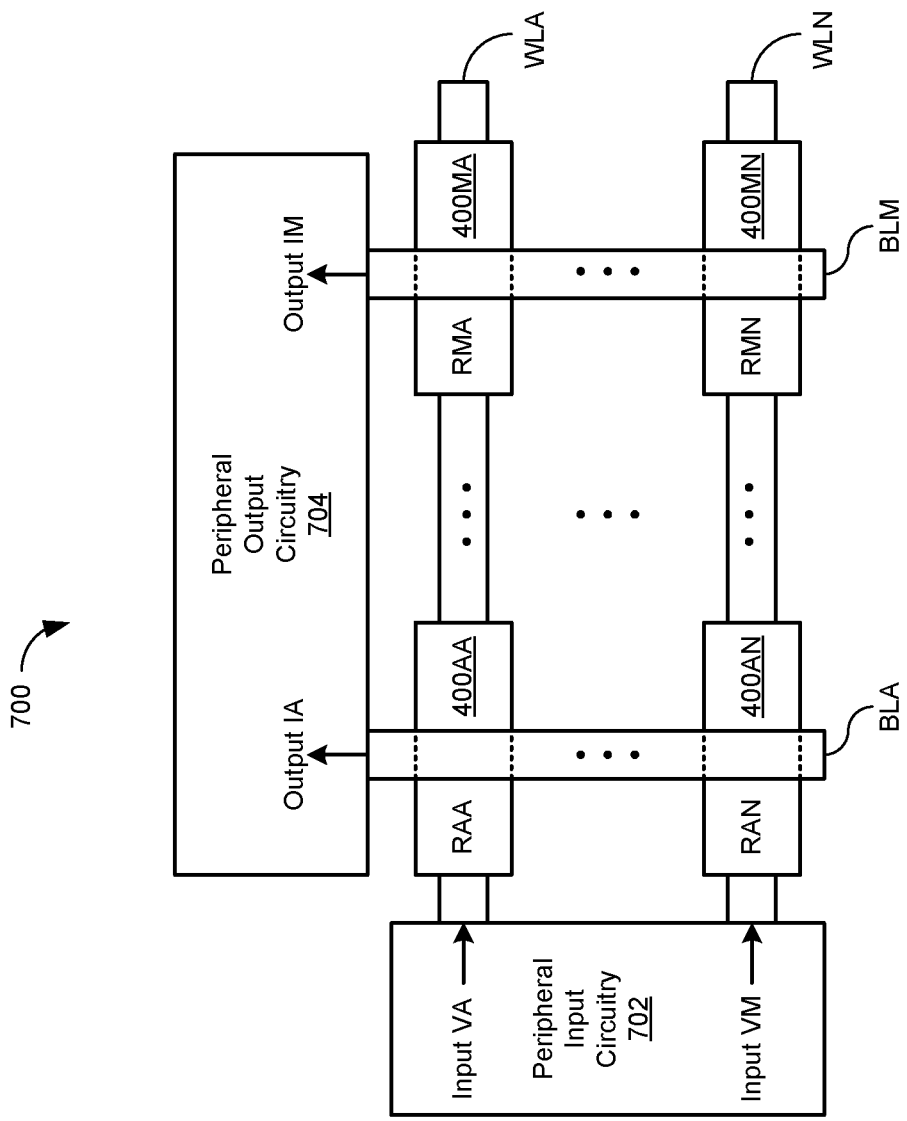
FIG. 8 illustrates the neural network of FIG. 7 in terms of voltages, currents, and resistances.

FIG. 8 illustrates the neural network 700 of FIG. 7 in terms of voltages, currents, and resistances. In the example of FIG. 8, each memory cell 400 in the array has been programmed with a predetermined weight in the form of a resistance R.

During operation, in an inference phase of the neural network 700, peripheral input circuitry 702 applies input voltages V to the word lines WL. Peripheral input circuitry 702 applies input voltage VA to word line WLA. Peripheral input circuitry 702 provides input voltage VM to word line WLM. Peripheral input circuitry 702 provides input voltages to other word lines WL in the neural network 700 in a similar manner.

Responsive to the input voltages V, the neural network 700 produces currents I on the bit lines BL. These currents I are read from the bit lines BL by the peripheral output circuitry 704. Peripheral output circuitry 704 reads current IA from bit line BLA. The current IA is given by the equation:

$$I_A = \frac{VA}{RAA} + \ldots + \frac{VM}{RAN}$$

Peripheral output circuitry 704 reads current IM from bit line BLM. The current IA is given by the equation:

$$I_M = \frac{VA}{RMA} + \ldots + \frac{VM}{RMN}$$

Peripheral output circuitry 704 reads currents I from other bit lines BL in the neural network 700 in a similar manner.

Figure 9:
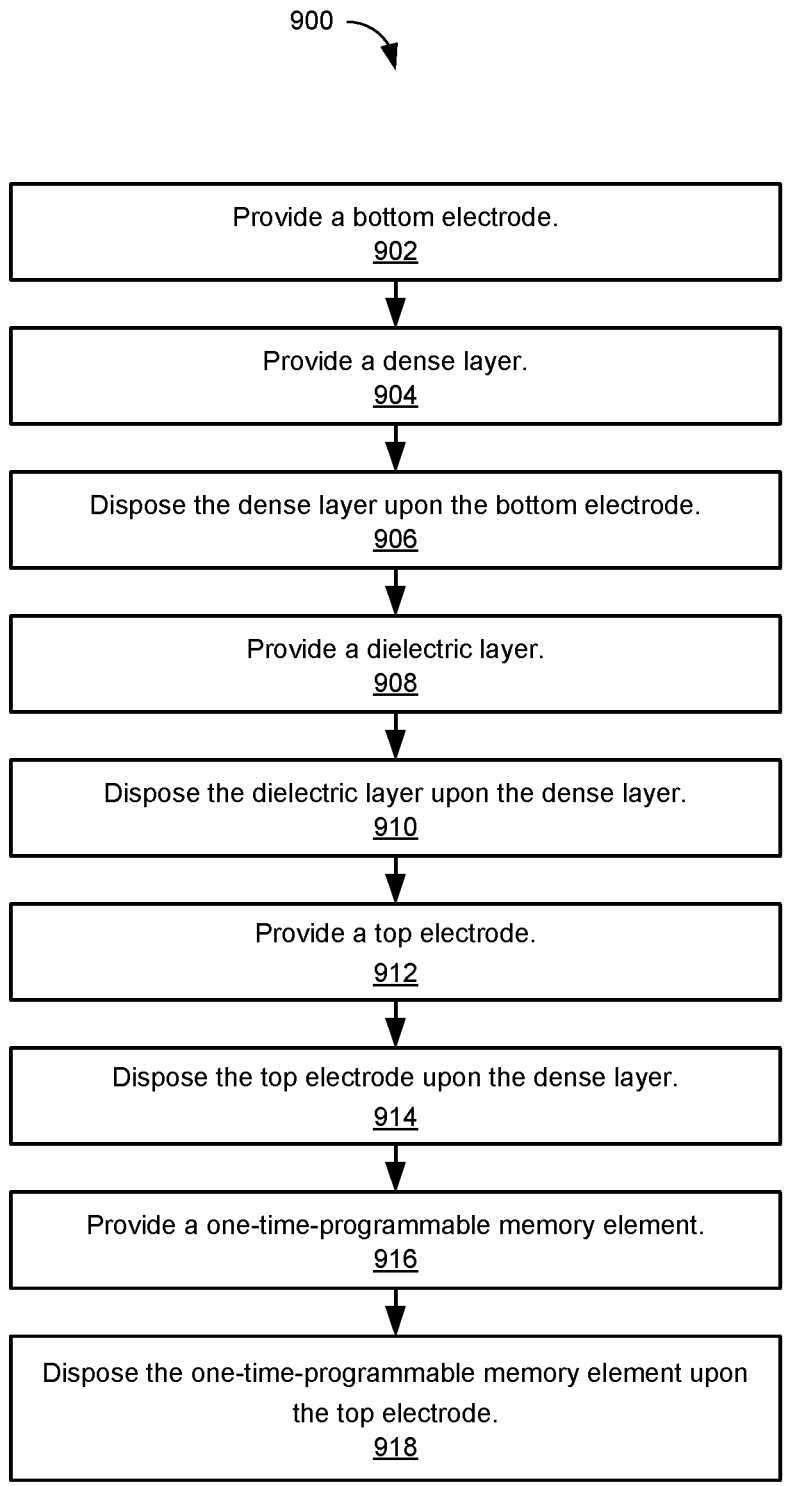
FIG. 9 illustrates a process for forming OTP memory devices according to some embodiments of the disclosed technologies.

FIG. 9 illustrates a process 900 for forming OTP memory devices according to some embodiments of the disclosed technologies. While elements of the disclosed processes are presented in a particular order, it should be understood that in various embodiments the elements may be performed in other orders, in parallel, omitted, or any combination thereof.

Referring to FIG. 9 and in conjunction with FIGS. 3 and 4, the process 900 may include providing a bottom electrode, at 902. For example, the bottom electrode 308 of FIG. 3 may be provided. As noted above, the bottom electrode may be an inert metal such as Pt or Pd.

Referring again to FIG. 9, the process 900 may include providing a dense layer, at 904. As noted above, the dense layer may be material such as $Al_2O_3$ or MgO. For example, referring again to FIG. 3, the dense layer 304 may be provided.

Referring again to FIG. 9, process 900 may include disposing the dense layer upon the bottom electrode, at 906. For example, referring again to FIG. 3, the dense layer 304 may be disposed upon the bottom electrode 308.

Referring again to FIG. 9, process 900 may include providing a dielectric layer, at 908. For example, the dielectric 306 of FIG. 3 may be provided. As noted above, any suitable dielectric material may be used.

Referring again to FIG. 9, process 900 may include disposing the dielectric layer upon the dense layer, at 910. For example, referring again to FIG. 3, the dielectric layer 306 may be disposed upon the dense layer 304.

Referring again to FIG. 9, the process 900 may include providing a top electrode, which may be Ag, at 912. For example, the top electrode 302 of FIG. 3 may be provided. As noted above, in some embodiments, the Ag top electrode may be doped or alloyed with other metals.

Referring again to FIG. 9, process 900 may include disposing the top electrode upon the dielectric layer, at 914. For example, referring again to FIG. 3, the dielectric 306 may be disposed in contact with the top electrode 302.

Referring again to FIG. 9, the process 900 may include providing a one-time-programmable memory element, at 916. For example, referring to FIG. 4, the OTP element 410 may be provided.

Referring again to FIG. 9, the process 900 may include disposing the one-time-programmable memory element upon the top electrode, at 918. For example, referring again to FIG. 4, the OTP element 410 may be disposed upon the upper surface of the top electrode 302.

Figure 10:
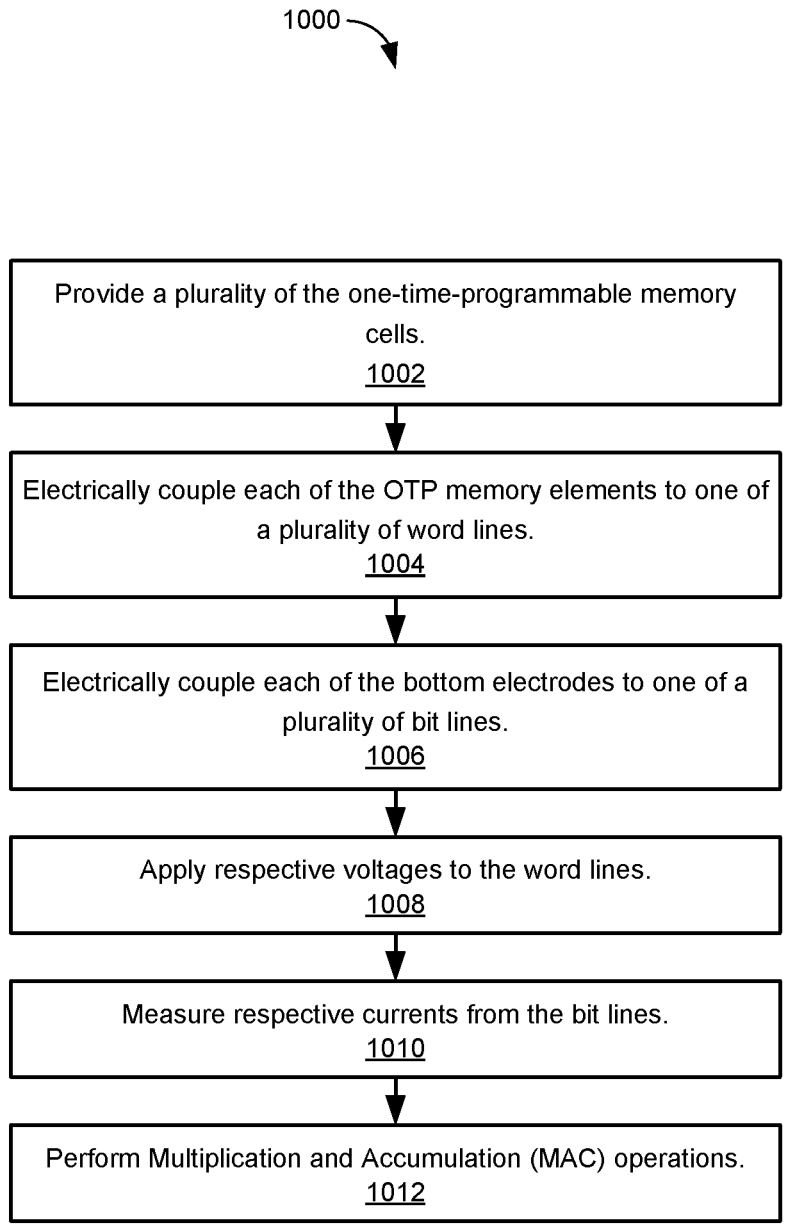
FIG. 10 illustrates a process for using OTP memory devices according to some embodiments of the disclosed technologies.

FIG. 10 illustrates a process 1000 for using OTP memory devices according to some embodiments of the disclosed technologies. For example, the process may be used with the neural networks of FIGS. 7 and 8.

Referring to FIG. 10, the process 1000 may include providing a plurality of OTP memory cells, at 1002. For example, the OTP memory cell 400 of FIG. 4 may be provided.

Referring again to FIG. 10, the process 1000 may include electrically coupling each of the OTP memory elements to one of a plurality of word lines, at 1004. For example, referring to FIG. 5, the OTP memory element 410 may be electrically coupled to the word line 512.

Referring again to FIG. 10, the process 1000 may include electrically coupling each of the bottom electrodes to one of a plurality of bit lines, at 1006. For example, referring again to FIG. 5, the bottom electrode 308 may be electrically coupled to the bit line 514.

Referring again to FIG. 10, the process 1000 may include applying respective voltages to the word lines, at 1008. For example, referring to FIG. 8, peripheral input circuitry 702 may apply voltages V to the word lines WL.

Referring again to FIG. 10, the process 1000 may include measuring respective currents from the bit lines, at 1010. Referring again to FIG. 8, peripheral output circuitry 704 may measure the currents I from the bit lines BL.

Referring again to FIG. 10, the process 1000 may include performing Multiplication and Accumulation (MAC) operations, at 1012. For example, the MAC operations may be performed by the neural network 700 of FIGS. 7 and 8, as described above.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

A person of ordinary skill in the art will recognize that they may make many changes to the details of the above-described memory device without departing from the underlying principles. Only the following claims, however, define the scope of the memory device.

What is claimed is:

1. A memory array comprising:
a plurality of one-time-programmable (OTP) memory cells each comprising:
a OTP memory element;
a top electrode having an upper surface in contact with the one-time-programmable memory element;
a dielectric layer in contact with a lower surface of the top electrode;
a bottom electrode; and
a dense layer having an upper surface in contact with the dielectric layer and a lower surface in contact with the bottom electrode, wherein the dense layer includes at least one of $Al_2O_3$ or MgO.

2. The memory array of claim 1, wherein the top electrode includes doped Ag.

3. The memory array of claim 1, wherein the top electrode includes alloyed Ag.

4. The memory array of claim 1, wherein the bottom electrode includes an inert metal.

5. The memory array of claim 1, wherein the one-time-programmable memory element includes a two-terminal resistive OTP memory element.

6. The memory array of claim 5, wherein the two-terminal resistive OTP memory element is based on at least one of oxide breakdown, metal injection, or fuse/anti-fuse.

7. The memory array of claim 1, further comprising:
a plurality of word lines, wherein each top electrode of the one-time-programmable memory cells is electrically coupled to at least one of the word lines; and
a plurality of bit lines, wherein each bottom electrode of the one-time-programmable memory cells is electrically coupled to at least one of the bit lines.

8. A neural network comprising:
the memory array of claim 7, wherein each of the OTP memory cells of the memory array is programmed with a respective weight;
a peripheral input circuitry configured to apply respective voltages to the word lines of the memory array; and
a peripheral output circuitry configured to measure respective currents from the bit lines of the memory array.

9. The neural network of claim 8, wherein the neural network is configured to perform Multiplication and Accumulation operations.

10. A device comprising:
a one-time-programmable memory element;
a top electrode including Ag;
a bottom electrode;
a dielectric layer in contact with the top electrode; and
a dense layer having an upper surface in contact with the dielectric layer and a lower surface in contact with the bottom electrode, wherein the dense layer includes at least one of $Al_2O_3$ or MgO.

11. The device of claim 10, wherein the top electrode is includes doped Ag.

12. The device of claim 10, wherein the top electrode is includes alloyed Ag.

13. The device of claim 10, wherein the bottom electrode includes an inert metal.

14. The device of claim 13, wherein the inert metal is includes Pt or Pd.

15. A one-time-programmable (OTP) memory cell comprising:
- a OTP memory element;
- a top electrode having an upper surface in contact with the OTP memory element;
- a dielectric layer in contact with a lower surface of the top electrode;
- a bottom electrode; and
- a dense layer having an upper surface in contact with the dielectric layer and a lower surface in contact with the bottom electrode, wherein the dense layer includes at least one of $Al_2O_3$ or MgO.

16. The OTP memory cell of claim 15, wherein the top electrode includes doped Ag.

17. The OTP memory cell of claim 15, wherein the top electrode includes alloyed Ag.

18. The OTP memory cell of claim 15, wherein the bottom electrode includes an inert metal.

19. The OTP memory cell of claim 15, wherein the OTP memory element includes a two-terminal resistive OTP memory element.

20. The OTP memory cell of claim 19, wherein the two-terminal resistive OTP memory element is based on at least one of oxide breakdown, metal injection, or fuse/antifuse.

* * * * *